United States Patent
Tanaka et al.

(10) Patent No.: US 10,243,130 B2
(45) Date of Patent: Mar. 26, 2019

(54) METHOD OF MANUFACTURING THERMOELECTRIC DEVICE

(71) Applicant: DENSO CORPORATION, Kariya, Aichi-pref. (JP)

(72) Inventors: Yasuhiro Tanaka, Kariya (JP); Atusi Sakaida, Kariya (JP); Toshihisa Taniguchi, Kariya (JP); Yoshihiko Shiraishi, Kariya (JP)

(73) Assignee: DENSO CORPORATION, Kariya, Aichi-pref. (JP)

(*) Notice: Subject to any disclaimer, the term of this patent is extended or adjusted under 35 U.S.C. 154(b) by 32 days.

(21) Appl. No.: 15/514,171

(22) PCT Filed: Aug. 19, 2015

(86) PCT No.: PCT/JP2015/073213
§ 371 (c)(1),
(2) Date: Mar. 24, 2017

(87) PCT Pub. No.: WO2016/051982
PCT Pub. Date: Apr. 7, 2016

(65) Prior Publication Data
US 2017/0309804 A1 Oct. 26, 2017

(30) Foreign Application Priority Data
Sep. 30, 2014 (JP) ................... 2014-200341

(51) Int. Cl.
*H02N 3/00* (2006.01)
*H01L 35/16* (2006.01)
(Continued)

(52) U.S. Cl.
CPC .............. *H01L 35/34* (2013.01); *H01L 35/16* (2013.01); *H01L 35/32* (2013.01); *H02N 3/00* (2013.01)

(58) Field of Classification Search
None
See application file for complete search history.

(56) References Cited

U.S. PATENT DOCUMENTS 6,127,619 A * 10/2000 Xi ........................... H01L 35/16
136/201
9,065,016 B2 * 6/2015 Peter ...................... H01L 35/32
(Continued)

FOREIGN PATENT DOCUMENTS

| JP | 2008-010584 A | 1/2008 |
| JP | 2008-244091 A | 10/2008 |
| JP | 2011187619 A | 9/2011 |

*Primary Examiner* — Eric R Smith
(74) *Attorney, Agent, or Firm* — Harness, Dickey & Pierce, P.L.C.

(57) ABSTRACT

In a step of pressing a laminate, the laminate is first pressed while being heated to a temperature lower than a melting point of a thermoplastic resin so as to elastically deform the thermoplastic resin and apply a pressure in a direction perpendicular to a laminating direction to thereby allow first and second conductive pastes to tightly adhere to front and rear surface patterns. Next, the laminate is pressed while being heated to a temperature equal to or higher than the melting point of the thermoplastic resin so as to fluidize the thermoplastic resin while allowing the thermoplastic resin to flow out from the laminate and apply a pressure in the direction perpendicular to the laminating direction to thereby allow the first and second conductive pastes are solid-sintered.

4 Claims, 7 Drawing Sheets

(51) Int. Cl.
    *H01L 35/32*    (2006.01)
    *H01L 35/34*    (2006.01)

(56) References Cited

U.S. PATENT DOCUMENTS

2008/0121263  A1*  5/2008  Schutte .................. H01L 35/32
                                                      136/203
2015/0144171  A1   5/2015  Taniguchi et al.

* cited by examiner

PART SET AS THERMOELECTRIC CONVERSION DEVICE 1

FLUIDIZATION OF THERMOPLASTIC RESIN

PRESSING BY PRESSING PLATE 100

PRESSING BY PRESSING PLATE 101

METHOD OF MANUFACTURING THERMOELECTRIC DEVICE

CROSS REFERENCE TO RELATED APPLICATIONS

This application is a U.S. National Phase Application under 35 U.S.C. 371 of International Application No. PCT/JP2015/073213 filed on Aug. 19, 2015 and published in Japanese as WO 2016/051982 A1 on Apr. 7, 2016. This application is based on and claims the benefit of priority from Japanese Patent Application No. 2014-200341 filed on Sep. 30, 2014. The entire disclosures of all of the above applications are incorporated herein by reference.

TECHNICAL FIELD

The present disclosure relates to a method of manufacturing a thermoelectric conversion device that has a plurality of N-type thermoelectric conversion elements and a plurality of P-type thermoelectric conversion elements alternately connected in series.

BACKGROUND ART

There are known thermoelectric conversion devices that have a plurality of N-type thermoelectric conversion elements and a plurality of P-type thermoelectric conversion elements alternately connected in series. This type of thermoelectric conversion device has been proposed as described in PTL 1.

The thermoelectric conversion device described in PTL 1 is manufactured by a method as described below. In other words, initially at a first step (a preparation step), a plurality of first and second via holes that include a thermoplastic resin and penetrate the thermoplastic resin in a thickness direction are formed. An insulating substrate that has the first via holes filled with a first conductive paste and has the second via holes filled with a second conductive paste is prepared.

Next at a second step (a laminate forming step), a front surface protecting member is disposed on a front surface of the insulating substrate, the front surface protecting member having a front surface pattern brought into contact with the first and second conductive pastes. Moreover, a rear surface protecting member is disposed on a rear surface of the insulating substrate, the rear surface protecting member having a rear surface pattern brought into contact with the first and second conductive pastes, to thereby form a laminate. At this time, at this second step, a predetermined gap is formed inside the laminate. Specifically, the predetermined gap herein referred to is a gap formed in the thermoplastic resin that configures the insulating substrate (a through hole or the like formed with a drill or the like), a gap formed in the front or rear surface pattern (a trench portion), or the like.

Next, at a third step (an integrating step), the laminate is pressed while being heated in a laminating direction by using pressing plates or the like to allow the first and second conductive pastes to configure first and second interlayer connecting members, respectively. Moreover, the first and second interlayer connecting members are electrically connected to the front and rear surface patterns. Here, as the first conductive paste, there is used one obtained by adding an organic solvent to a powder of an alloy that has a plurality of metal atoms that maintain a predetermined crystal structure, so as to form a paste. Moreover, as the second conductive paste, there is used one obtained by adding the organic solvent to a powder of a metal of a type different from that of the alloy, so as to form a paste.

Specifically, at the above-described third step, the laminate is initially heated at a temperature that allows the organic solvent to evaporate, so as to evaporate the organic solvent. Next, the laminate is pressed, while being heated at a temperature that allows the thermoplastic resin that configures the insulating substrate to fluidize (i.e., a temperature equal to or higher than a melting point of the thermoplastic resin) and is lower than a sintering temperature of each of the first and second conductive pastes. With the pressing, the first conductive paste is solid-sintered to configure the first interlayer connecting member, and the second conductive paste is solid-sintered to configure the second interlayer connecting member, while the thermoplastic resin is fluidized into the gap. In this manufacturing method, the thermoplastic resin flows (fluidizes) into the gap during pressing, and hence a pressing force applied to the thermoplastic resin (a part of the thermoplastic resin positioned around each of the first and second via holes) becomes smaller. The pressing force that would originally have been applied to this thermoplastic resin is thereby applied to the first and second conductive pastes instead. Accordingly, the pressing force applied by the pressing plates to the first and second conductive pastes becomes large, which makes it easier for each of the first and second conductive pastes are solid-sintered more reliably. Therefore, the thermoelectric conversion device manufactured by this method allows the first and second conductive pastes are solid-sintered reliably, to thereby achieve high thermoelectric conversion efficiency per unit area.

As such, at the above-described third step, the fluidization of the thermoplastic resin that configures the insulating substrate and the sintering of the first and second conductive pastes are performed simultaneously, to thereby ensure the first and second conductive pastes are solid-sintered reliably.

CITATION LIST

Patent Literature

[PTL 1]
  JP-A-2014-7376

SUMMARY OF INVENTION

Technical Problem

At the above-described third step described in PTL 1, a workpiece (a laminate), which is obtained by sandwiching the first and second conductive pastes, along with the insulating substrate (the thermoplastic resin), between the front and rear surface protecting members, is usually pressed while being heated. At this time, at a part of the laminate other than the front surface or the rear surface, in other words, at an outer edge part, the thermoplastic resin that configures the insulating substrate is not covered. As a result, when the laminate is pressed at the third step described above, the thermoplastic resin flows out of the laminate. In this manufacturing method, as described above, the laminate is pressed while being heated at a temperature that allows the thermoplastic resin to fluidize (a temperature equal to or higher than the melting point of the thermoplastic resin). In other words, in this manufacturing method, the thermoplastic resin, which has been liquefied, is fluidized by the pressing at the third step described above. Here, if the thermoplastic resin fluidizes, a pressure in a direction perpendicular to the laminating direction is applied to the first and second conductive pastes, to thereby cause the first and second conductive pastes to move (apply a pressure) in the laminating direction, to promote the connection or fixing of the first and second conductive pastes to the front and rear surface patterns.

At this pressing, there may be a case where a clearance caused by asperities or the like formed in the first and second conductive pastes is made between each of the first and second conductive pastes and each of the front and rear surface patterns. As a result, there may be a case where the thermoplastic resin enters this clearance. If the liquefied thermoplastic resin is fluidized, in particular, the thermoplastic resin more easily enters this clearance. If the liquefied thermoplastic resin, which is fluidized by pressing, enters this clearance, the connection or fixing of the first and second conductive pastes to the front and rear surface patterns is inhibited. Consequently, there may be a case, in this manufacturing method, where the first and second conductive pastes, along with the thermoplastic resin, disadvantageously fluidize (move). Moreover, the first and second conductive pastes may even flow out of the workpiece (the laminate).

Accordingly, in this manufacturing method, it was necessary to prevent the thermoplastic resin from flowing out of the laminate as much as possible at the pressing at the third step described above. In other words, in this manufacturing method, in order not to fluidize the first and second conductive pastes at the pressing at a high temperature to fluidize the thermoplastic resin, it was necessary to adopt a procedure such as using a thermoplastic resin having a high elastic modulus, for example, as the thermoplastic resin that configures the insulating, or other procedures.

In this manufacturing method, in order to promote fluidization of the thermoplastic resin to promote a pressing force to the first and second conductive pastes, the above-described predetermined gap were formed in the thermoplastic resin, the front surface pattern, the rear surface pattern, and the like. In other words, in this manufacturing method, measures to allow the thermoplastic resin to flow out of the laminate cannot be taken as the measures to promote fluidization of the thermoplastic resin, and hence the measures to form the above-described predetermined gap were taken. As such, in this manufacturing method, the above-described predetermined gap is formed, and the thermoplastic resin is fluidized not to an outside of the laminate but into the gap, to thereby promote the fluidization of the thermoplastic resin to such a degree as not to fluidize the first and second conductive pastes, and promote a pressing force to the first and second conductive pastes.

In the case where the thermoplastic resin is allowed to flow out of the laminate, the fluidization of the thermoplastic resin can be promoted even if the above-described predetermined gap is not necessarily provided. Moreover, the fluidization of the thermoplastic resin can even further be promoted than in the case where the above-described predetermined gap is provided. Accordingly, as long as the first and second conductive pastes can be prevented from moving, it is desirable to press the laminate while allowing the thermoplastic resin to flow out of the laminate.

In consideration of the above, the present discloser investigated the methods of promoting fluidization of the thermoplastic resin, regardless of the presence or absence of the above-described predetermined gap, to thereby promote a pressing force to the first and second conductive pastes. Consequently, the present discloser has finally disclosed the method of less easily allowing the first and second conductive pastes to fluidize, even in the case where the thermoplastic resin is allowed to flow out of the laminate to fluidize the thermoplastic resin.

The present disclosure has a main object of providing a method of less easily allowing the first and second conductive pastes to fluidize, in the method of manufacturing a thermoelectric conversion device, in which, when the workpiece (the laminate) is pressed, the thermoplastic resin that configures the insulating substrate is allowed to flow out of the laminate to thereby promote fluidization of the thermoplastic resin.

Solution to Problem

In a first aspect of the present disclosure, in a method of manufacturing a thermoelectric conversion device, a solvent evaporation step, a paste compression step, and a paste solid-sintering step, which will be described below, are performed in this order at a step of pressing the laminate in the laminating direction of the laminate while heating the laminate.

In other words, at the solvent evaporation step, the laminate is heated to a temperature that allows the organic solvent to evaporate and is lower than a melting point of the thermoplastic resin and lower than a sintering temperature of each of the first and second conductive pastes to thereby evaporate the organic solvent added to the first and second conductive pastes. At the paste compression step, the laminate is pressed in the laminating direction of the laminate while being heated to a temperature that allows the thermoplastic resin to be elastically deformed and is lower than the melting point of the thermoplastic resin and lower than the sintering temperature of each of the first and second conductive pastes. As a result, the thermoplastic resin is elastically deformed, thereby applying a pressure in a direction perpendicular to the laminating direction of the laminate to the first and second conductive pastes. At the paste solid-sintering step, the laminate is pressed in the laminating direction of the laminate while being heated to a temperature equal to or higher than the melting point of the thermoplastic resin and equal to or higher than the sintering temperature of each of the first and second conductive pastes. As a result, the thermoplastic resin is fluidized inside the laminate while being allowed to flow out of the laminate, thereby applying a pressure in the direction perpendicular to the laminating direction of the laminate to the first and second conductive pastes. Furthermore, at the paste solid-sintering step, the first conductive paste is solid-sintered to configure a first interlayer connecting member, and the second conductive paste is solid-sintered to configure a second interlayer connecting member.

Accordingly, in the first aspect of the present disclosure, the thermoplastic resin is elastically deformed as described above to thereby apply a pressure in the direction perpendicular to the laminating direction of the laminate to the first and second conductive pastes at the third step. At this time, unlike the manufacturing method described in PTL 1, in which the liquefied thermoplastic resin is fluidized, the thermoplastic resin is elastically deformed. Accordingly, even if a clearance is made between each of the first and second conductive pastes and the front surface pattern or the rear surface pattern, the thermoplastic resin less easily enters this clearance. Therefore, a phenomenon less easily occurs in which the thermoplastic resin enters this clearance and inhibits connection or fixing of the first and second conductive pastes to the front and rear surface patterns, to thereby disadvantageously allow the first and second conductive pastes to fluidize. The pressure in the direction perpendicular to the laminating direction of the laminate is more easily applied to the first and second conductive pastes, without the thermoplastic resin being allowed to enter this clearance. The first and second conductive pastes are thereby allowed to tightly adhere to the front and rear surface patterns, and the connection or fixing of the first and second conductive pastes to the front and rear surface patterns is more easily promoted.

As such, in the first aspect of the present disclosure, the first and second conductive pastes are allowed to tightly adhere to the front and rear surface patterns before the pressing at a temperature equal to or higher than the melting point of the thermoplastic resin, and hence the first and second conductive pastes less easily fluidize during pressing at the temperature equal to or higher than the melting point. Moreover, the thermoplastic resin is fluidized inside the laminate while being allowed to flow out of the laminate, and hence when compared with the manufacturing method described in PTL 1, a larger amount of the thermoplastic resin inside the laminate is allowed to flow out. Consequently, in the first aspect of the present disclosure, a part of the laminate where the thermoplastic resin is positioned becomes thinner than a part of the laminate where the first and second conductive pastes are positioned. Even if the first and second conductive pastes intend to move in a direction of a plane perpendicular to the laminating direction of the laminate, the first and second conductive pastes are thereby more easily stopped by an anchor effect produced by the part of the laminate thus made thinner. This also results in the first and second conductive pastes less easily fluidize. Thus in the first aspect of the present disclosure, when the laminate is pressed, the first and second conductive pastes can be less easily fluidized and more easily be fixed and maintained at positions before pressing, and at the same time the thermoplastic resin can be allowed to flow out of the workpiece (the laminate) to thereby promote fluidization of the thermoplastic resin.

The reference sign in parentheses for each means described in the appended claims indicates a corresponding relation to the specific means described in embodiments below.

DESCRIPTION OF EMBODIMENTS

Embodiments of the present disclosure will hereinafter be described based on the drawings. In the following embodiments, the same reference signs indicate elements that are mutually the same or equivalent.

First Embodiment

Figure 1:
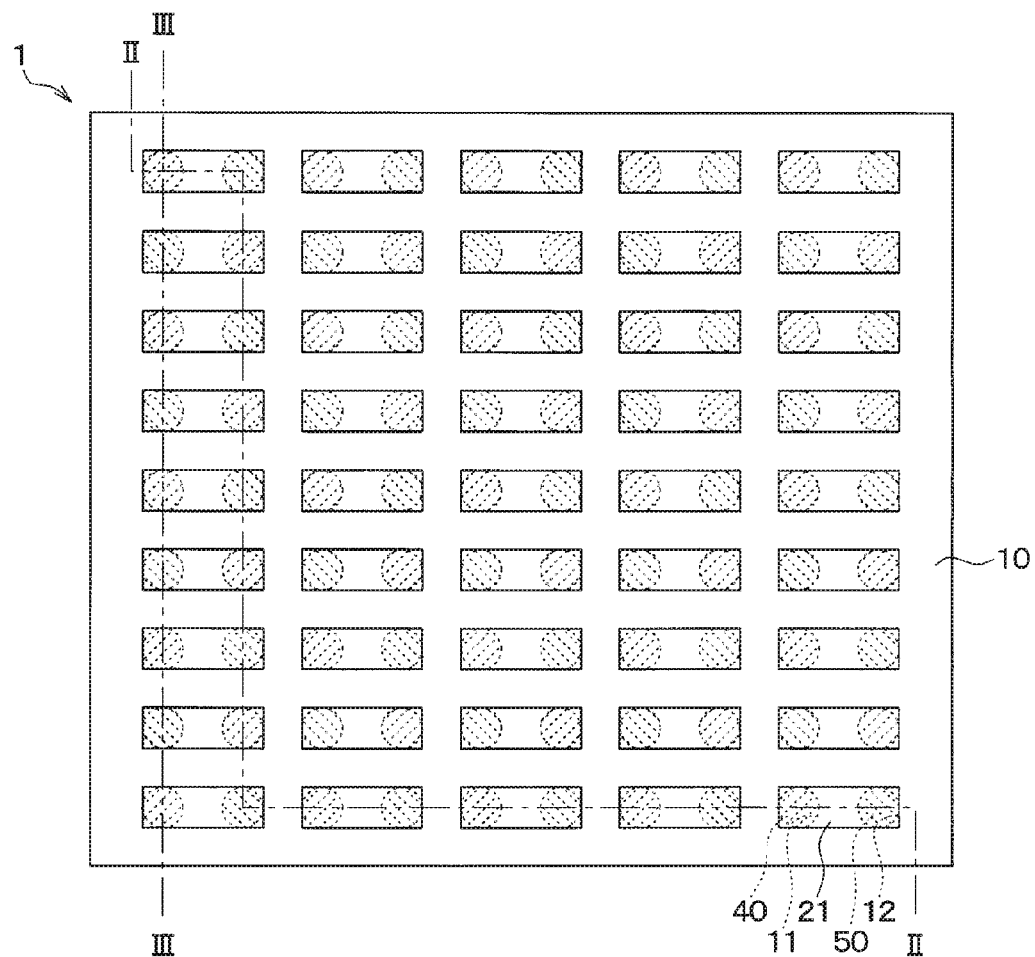
FIG. 1 is a diagram that shows a planar configuration of a thermoelectric conversion device according to a first embodiment.
Figure 2:
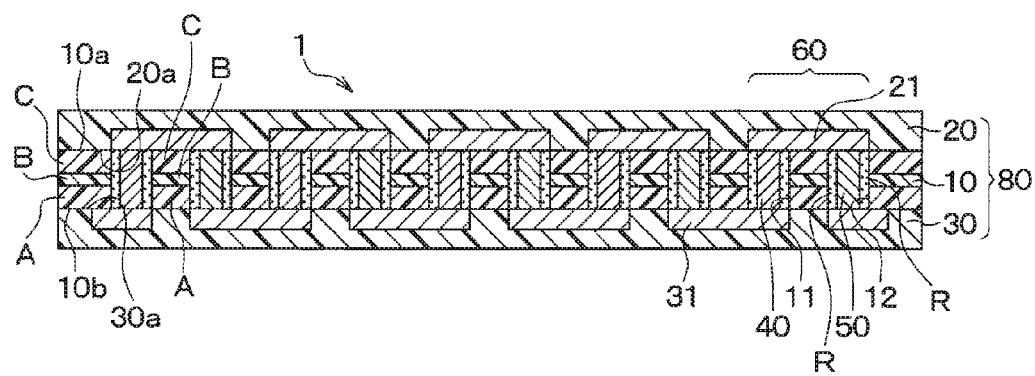
FIG. 2 is a diagram that shows a cross-section, taken along the line II-II, of the thermoelectric conversion device shown in FIG. 1.
Figure 3:
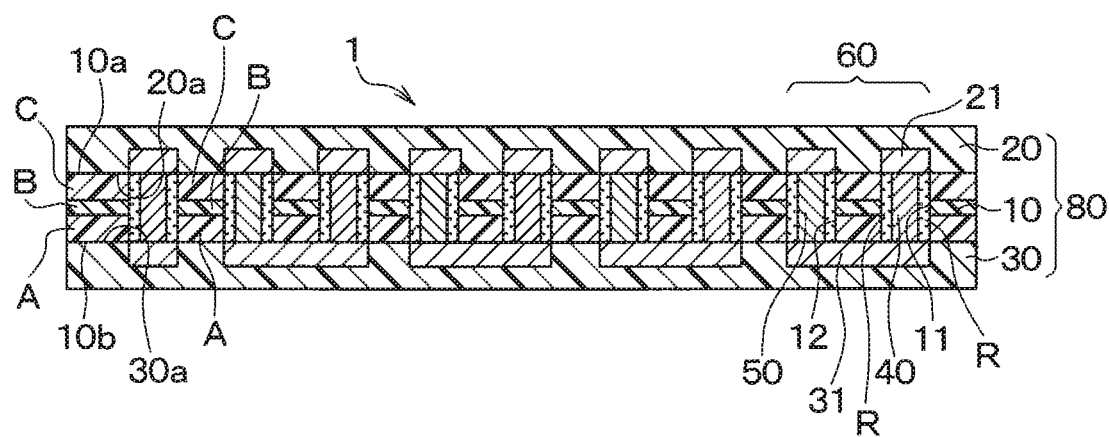
FIG. 3 is a diagram that shows a cross-section, taken along the line of the thermoelectric conversion device shown in FIG. 1.

With reference to FIGS. 1 to 3, a thermoelectric conversion device 1 according to a first embodiment of the present disclosure will be described. As shown in FIGS. 1 to 3, the thermoelectric conversion device 1 is made up of an insulating substrate 10, a front surface protecting member 20, and a rear surface protecting member 30, which are integrated as a unit, and first and second interlayer connecting members 40 and 50 disposed in the integrated unit. The first and second interlayer connecting members 40 and 50 are made of metals different from each other and are alternately connected in series.

In FIG. 1, the front surface protecting member 20 is omitted for illustration purpose. Moreover, FIG. 1 shows the first and second interlayer connecting members 40 and 50 in a hatched manner, although these are not shown in a cross-sectional view.

As shown in FIGS. 2 and 3, the insulating substrate 10 is a substrate having a front surface 10a and a rear surface 10b. The insulating substrate 10 includes a thermoplastic resin, and first via holes 11 and second via holes 12 which are formed to penetrate the thermoplastic resin in a thickness direction. Specifically, in the present embodiment, the insulating substrate 10 is configured by a thermoplastic resin film which contains polyetheretherketone (PEEK) or polyetherimide (PEI), and is formed in a rectangular shape in plan view. In this insulating substrate 10, a plurality of first and second via holes 11 and 12, each penetrating the insulating substrate 10 in the thickness direction, are alternately arranged to form a staggered pattern.

As shown in FIGS. 2 and 3, in the thermoelectric conversion device 1 according to the present embodiment, the first and second via holes 11 and 12 are formed in a cylindrical shape with a constant diameter from the front surface 10a to the rear surface 10b. However, the first and second via holes 11 and 12 may also have a cylindrical shape with a diameter decreasing from the front surface 10a toward the rear surface 10b, for example. Moreover, the first and second via holes 11 and 12 may have a tapered shape with a diameter decreasing from the front surface 10a toward the rear surface 10b, or may be a prismatic shape.

As shown in FIGS. 1 to 3, the first interlayer connecting members 40 are each disposed in the first via holes 11, and the second interlayer connecting members 50, which are mainly composed of a metal different from that of the first interlayer connecting members 40, are each disposed in the second via holes 12. In other words, the first and second interlayer connecting members 40 and 50 are alternately arranged in the insulating substrate 10.

The first interlayer connecting member 40 is made of a conductive paste that contains, for example, a powder of a Bi—Sb—Te alloy (metal particles) which forms a P-type material. Moreover, the second interlayer connecting member 50 is made of a conductive paste that contains, for example, a powder of a Bi—Te alloy (metal particles) which forms an N-type material. However, the conductive pastes that form the first and second interlayer connecting members 40 and 50 are not limited to those described above.

As shown in FIGS. 2 and 3, the front surface protecting member configured with a thermoplastic resin film which contains polyetheretherketone (PEEK) or polyetherimide (PEI) and is formed in a rectangular shape in plan view is disposed on the front surface 10a of the insulating substrate 10. This front surface protecting member 20 has the same size as that of the insulating substrate 10 in plan view, and a plurality of front surface patterns 21, which are formed by patterning a copper foil or the like, are arranged to be spaced from one another on one surface 20a that faces the insulating substrate 10. The front surface patterns 21 are each electrically connected as appropriate to the first and second interlayer connecting members 40 and 50.

Specifically, in the thermoelectric conversion device 1 according to the present embodiment, a pair 60 is made up of one first interlayer connecting member 40 and one second interlayer connecting member 50 that are adjacent to each other. The first and second interlayer connecting members 40 and 50 in each pair 60 are connected to the same front surface pattern 21. In other words, the first and second interlayer connecting members 40 and 50 in each pair 60 are electrically connected via the front surface pattern 21. In the thermoelectric conversion device 1 according to the present embodiment, one first interlayer connecting member 40 and one second interlayer connecting member 50 that are adjacent to each other in a long side direction of the insulating substrate 10 (the right and left direction in FIG. 1) constitute the pair 60.

Moreover, as shown in FIGS. 2 and 3, the rear surface protecting member 30 configured with a thermoplastic resin film which contains polyetheretherketone (PEEK) or polyetherimide (PEI) and is formed in a rectangular shape in plan view is disposed on the rear surface 10b of the insulating substrate 10. This rear surface protecting member 30 has the same size as that of the insulating substrate 10 in plan view, and a plurality of rear surface patterns 31, which are formed by patterning a copper foil or the like, are arranged to be spaced from one another on one surface 30a that faces the insulating substrate 10. The rear surface patterns 31 are each electrically connected as appropriate to the first and second interlayer connecting members 40 and 50.

Specifically, in the adjacent pairs 60 of the thermoelectric conversion device 1 according to the present embodiment, the first interlayer connecting member 40 in one pair 60 and the second interlayer connecting member 50 in the other pair 60 are connected to the same rear surface pattern 31. In other words, the first interlayer connecting member 40 and the second interlayer connecting member 50 of different pairs 60 are electrically connected to each other via the rear surface pattern 31.

As shown in FIG. 2, in the thermoelectric conversion device 1 according to the present embodiment, two pairs 60 of thermoelectric elements arranged in the long side direction of the insulating substrate 10 (the right and left direction in FIG. 1) are basically defined as adjacent pairs 60. Moreover, as shown in FIG. 3, two pairs 60 arranged in a short side direction (the up and down direction in FIG. 1) are defined as adjacent pairs 60 in an outer periphery of the insulating substrate 10. Therefore, the first and second interlayer connecting members 40 and 50 are alternately connected in series in the long side direction of the insulating substrate 10 and then turned back to be again alternately connected in series in the long side direction. In other words, the first and second interlayer connecting members 40 and 50 are alternately connected in series in a zigzag shape.

In a cross-section different from those in FIGS. 2 and 3, the rear surface protecting member 30 has an interlayer connecting member that is electrically connected to the rear surface pattern 31 and exposed from one of the surfaces of the rear surface protecting member 30 which is opposite from the insulating substrate 10. In the thermoelectric conversion device 1 according to the present embodiment, this interlayer connecting member enables electrical connection to the outside.

Moreover, as shown in FIGS. 2 and 3, in the thermoelectric conversion device 1 according to the present embodiment, the insulating substrate 10 is configured with a layer A (a first layer) made of a thermoplastic resin, a layer B (a second layer) made of a thermosetting resin, and a layer C (a third layer) made of a thermoplastic resin, which are disposed in this order in the thickness direction. Specifically, as shown in FIGS. 2 and 3, in the thermoelectric conversion device 1 according to the present embodiment, the layer B made of a thermosetting resin is provided to be positioned at the center of the insulating substrate 10 in a laminating direction of a laminate 80. The first and second via holes 11 and 12 are formed to penetrate the layer A (the first layer) made of a thermoplastic resin, the layer B (the second layer) made of a thermosetting resin, and the layer C (the third layer) made of a thermoplastic resin in the thickness direction. In other words, the thermoelectric conversion device 1 according to the present embodiment is configured such that the thermosetting resin is disposed around the respective first and second interlayer connecting members 40 and 50 when viewed in the laminating direction of the laminate 80. Specifically, this thermosetting resin is configured with a thermosetting resin film mainly composed of polyimide or the like.

The configuration of the thermoelectric conversion device 1 according to the present embodiment is described above. In such a thermoelectric conversion device 1, for example, when each of the first and second via holes 11 and 12 has a diameter ϕ of 0.7 mm, and the insulating substrate 10 has a thickness of 1 mm, and a total of approximately 900 first and second interlayer connecting members 40 and 50, are disposed, electric power of approximately 2.5 mW can be obtained at a temperature difference of 10° C.

Next, with reference to FIGS. 4A to 7, a method of manufacturing the thermoelectric conversion device 1 according to the present embodiment will be described. FIGS. 4A-4H are cross-sectional views taken along the line II-II of FIG. 1.

Figure 4A:
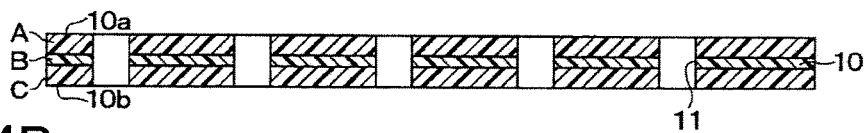
FIGS. 4A-4H are a cross-sectional view that shows a step of manufacturing the thermoelectric conversion device shown in FIG. 1.

First, as shown in FIG. 4A, in the manufacturing method according to the present embodiment, the insulating substrate 10 is prepared, and a plurality of first via holes 11 are formed by a drill or the like.

Figure 4B:
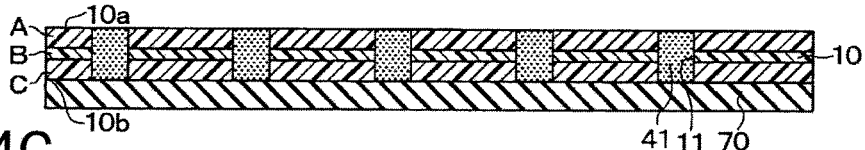

Next, as shown in FIG. 4B, in the manufacturing method according to the present embodiment, the respective first via holes 11 are filled with a first conductive paste 41.

As a method (a device) of filling the first via holes 11 with the first conductive paste 41, the method (the device) described in Japanese Patent Application No. 2010-50356 may be used, for example. To be brief, the method of filling the first via holes 11 with the first conductive paste 41 is as follows: as shown in FIG. 4B, the insulating substrate 10 is disposed on a holding table such that the rear surface 10b faces absorbent paper 70; the absorbent paper 70 may be made of any material that can absorb an organic solvent in the first conductive paste 41, and general high-quality paper or the like is used for the absorbent paper 70; each of the first via holes 11 is filled with the first conductive paste 41 while the first conductive paste 41 is melted; and a large portion of the organic solvent in the first conductive paste 41 is thereby absorbed by the absorbent paper 70, causing the alloy powder to be disposed in each of the first via holes 11 in a close contact manner.

At this time, in the manufacturing method according to the present embodiment, the first conductive paste 41 obtained by adding an organic solvent to a powder of an alloy that has a plurality of metal atoms that maintain a predetermined crystal structure and processing the powder of the alloy into a paste is used for the filling. Specifically, as the first conductive paste 41, a paste made by adding an organic solvent, such as paraffin, having a melting point of 43° C. to a powder of an alloy that has metal atoms that maintain a predetermined crystal structure is used. Accordingly, when the first conductive paste 41 is used for the filling, the filling is performed in a state where the front surface 10a of the insulating substrate 10 is heated to about 43° C. As the powder of an alloy that configures the first conductive paste 41, Bi—Sb—Te formed by mechanical alloying or the like can be used.

Figure 4C:
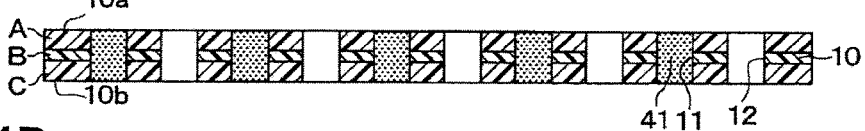

Subsequently, in the manufacturing method according to the present embodiment, as shown in FIG. 4C, a plurality of second via holes 12 are formed in the insulating substrate 10 by using a drill or the like. As described above, the second via holes 12 are alternately arranged with the first via holes 11 to form a staggered pattern with the first via holes 11.

Figure 4D:
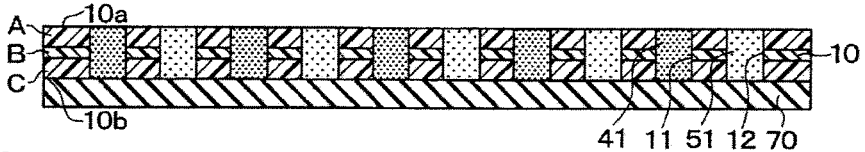

Next, in the manufacturing method according to the present embodiment, as shown in FIG. 4D, the insulating substrate 10 is again disposed on the holding table such that the rear surface 10b faces the absorbent paper 70. In a similar manner to filling with the first conductive paste 41, the second via holes 12 are filled with the second conductive paste 51. A large portion of the organic solvent in the second conductive paste 51 is thereby absorbed by the absorbent paper 70, causing the alloy powder to be disposed in each of the second via holes 12 in a close contact manner.

At this time, in the manufacturing method according to the present embodiment, the second conductive paste 51 obtained by adding an organic solvent to a powder of a metal of a type different from that of the alloy added to the first via holes 11 and processing the powder of the metal into a paste is used for the filling. Specifically, as the second conductive paste 51, a paste made by adding an organic solvent, such as terpineol, having a melting point at normal temperature, to a powder of an alloy that has metal atoms different from those configuring the first conductive paste 41 and maintain a predetermined crystal structure is used. In other words, as the organic solvent that configures the second conductive paste 51, one that has a melting point lower than that of the organic solvent that configures the first conductive paste 41 is used. When the second conductive paste 51 is used for the filling, the filling is performed in a state where the front surface 10a of the insulating substrate 10 is held at normal temperature. In other words, in the manufacturing method according to the present embodiment, the filling with the second conductive paste 51 is performed in a state where the organic solvent included in the first conductive paste 41 is solidified. As a result, infiltration of the second conductive paste 51 into the first via hole 11 is thereby suppressed. As the powder of an alloy that configures the second conductive paste 51, Bi—Te or the like formed by mechanical alloying can be used.

Moreover, as shown in FIGS. 4A to 4D, in the manufacturing method according to the present embodiment, there is prepared the insulating substrate 10 that has the layer A configured with a thermoplastic resin, the layer B configured with a thermosetting resin, and the layer C configured with a thermoplastic resin, which are disposed in this order in the thickness direction. Specifically, in the manufacturing method according to the present embodiment, there is prepared the insulating substrate 10 that has the layer B, configured with a thermosetting resin, provided to be positioned at the center of the insulating substrate 10 in the laminating direction of the laminate 80. In other words, in the manufacturing method according to the present embodiment, there is prepared the insulating substrate 10 in which the thermoplastic resin layers A and C having the same thickness are provided on each of both sides of the layer B configured with a thermosetting resin. At this time, the first and second via holes 11 and 12 are formed to penetrate the layer A configured with a thermoplastic resin, the layer B configured with a thermosetting resin, and the layer C configured with a thermoplastic resin in the thickness direction. In other words, in the manufacturing method according to the present embodiment, there is prepared the insulating substrate 10 in which the layer B configured with a thermosetting resin is disposed on each perimeter of the first and second interlayer connecting members 40 and 50, when viewed from the laminating direction of the laminate 80.

In the manufacturing method according to the present embodiment, with such an insulating substrate 10 thus prepared, even if the first and second conductive pastes 41 and 51 fluidize by being pressed at a temperature equal to or higher than the melting point of the thermoplastic resin at the third step, the first and second conductive pastes 41 and 51 impinge on the thermosetting resin positioned therearound, and their fluidization is thereby restrained. Therefore, in the manufacturing method according to the present embodiment, the first and second conductive pastes 41 and 51 particularly less easily fluidize and are more easily fixed and maintained at positions before the pressing. Moreover, at this time, tight adhesiveness can be improved between the insulating substrate 10 and the front and rear surface patterns 21 and 31 or the front and rear surface protecting members 20 and 30 compared with the case of preparing the insulating substrate 10 in which the layers B configured with a thermosetting resin are disposed on both ends in the thickness direction. In the manufacturing method according to the present embodiment, the improved tight adhesiveness between the insulating substrate 10 and the front and rear surface protecting members 20 and 30 enables the thermoplastic resin to be reliably disposed between the insulating substrate 10 and the adjacent front and rear surface patterns 21 and 31. Accordingly, a phenomenon such as leakage current flowing between two adjacent front surface patterns 21 or between two adjacent rear surface patterns 31 can be reduced.

Moreover, as described above, in the manufacturing method according to the present embodiment, there is prepared the insulating substrate 10 in which the layer B configured with a thermosetting resin is provided to be positioned at the center of the insulating substrate 10 in the laminating direction of the laminate 80. In other words, there is prepared the insulating substrate 10 in which the thermoplastic resin layers A and C having an equivalent thickness are provided on both sides of the layer B configured with a thermosetting resin. Accordingly, in the manufacturing method according to the present embodiment, warpage of the laminate 80 due to thermal expansion or thermal contraction of the layers A and C configured with a thermoplastic resin is less likely to occur after the third step.

As described above, in the manufacturing method according to the present embodiment, the insulating substrate 10 filled with the first and second conductive pastes 41 and 51 is prepared. As such, in the manufacturing method according to the present embodiment, the step of preparing the insulating substrate 10 corresponds to a "first step".

Figure 4E:
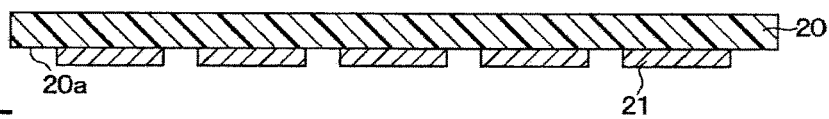
Figure 4F:
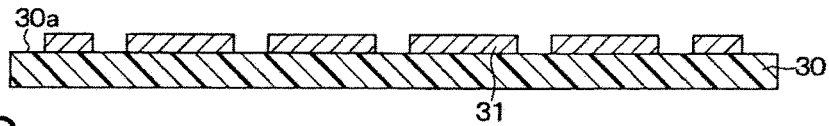

Moreover, as shown in FIGS. 4E and 4F, at a step different from the above-described first step in the manufacturing method according to the present embodiment, copper foils or the like are formed on one surface 20a and one surface 30a of the front and rear surface protecting members 20 and 30, respectively, which face the insulating substrate 10. These copper foils are then subjected to patterning as appropriate, to thereby prepare the front surface protecting member 20 on which the plurality of front surface patterns 21 spaced apart from one another are formed, and the rear surface protecting member 30 on which the plurality of rear surface patterns 31 spaced apart from one another are formed.

Figure 4G:
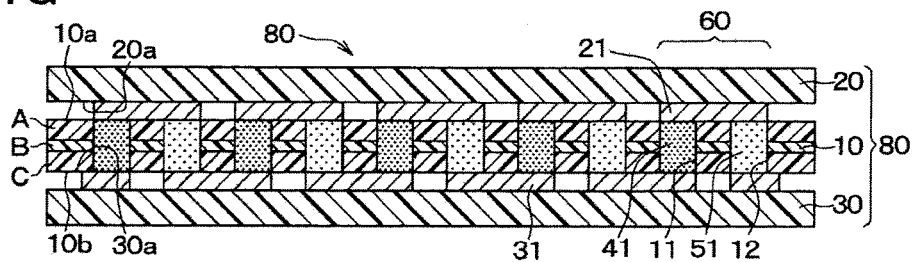

Afterwards, as shown in FIG. 4G, in the manufacturing method according to the present embodiment, the rear surface protecting member 30, the insulating substrate 10, and the front surface protecting member 20 are laminated in this order to configure the laminate 80.

Specifically, when the first conductive paste 41 which fills one first via hole 11 and the second conductive paste 51 which fills one second via hole 12 adjacent to the first via hole 11 are defined as a pair 60, the front surface protecting member 20 is disposed as follows in the manufacturing method according to the present embodiment. In the manufacturing method according to the present embodiment, the front surface protecting member 20 is disposed on the front surface 10a of the insulating substrate 10 in a state where the first and second conductive pastes 41 and 51 in each pair 60 are in contact with the same front surface pattern 21. In the present embodiment, as described above, the first conductive paste 41 which fills one first via hole 11 and the second conductive paste 51 which fills one second via hole 12 adjacent to the first via hole 11 in the long side direction of the insulating substrate 10 (the right and left direction in the plane of FIG. 1) are defined as the pair 60.

Moreover, in the manufacturing method according to the present embodiment, the rear surface protecting member 30 is disposed on the rear surface 10b of the insulating substrate 10 in a state where the first conductive paste 41 in one pair 60 and the second conductive paste 51 in the other pair 60, out of the adjacent pairs 60, are in contact with the same rear surface pattern 31. In the present embodiment, as described above, the two pairs 60 of thermoelectric elements arranged in the long side direction of the insulating substrate 10 (the right and left direction in the plane of FIG. 1) are defined as the adjacent pairs 60. Moreover, in the outer edge of the insulating substrate 10, the two pairs 60 arranged along the short side direction are made into the adjacent pairs 60. As described above, in the manufacturing method according to the present embodiment, a step of forming the laminate 80 corresponds to a "second step".

Figure 4H:
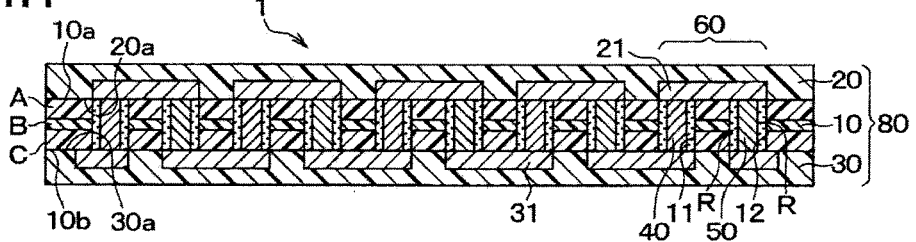

Subsequently, as shown in FIG. 4H, in the manufacturing method according to the present embodiment, this laminate 80 is disposed between a pair of pressing plates, and pressed from both of upper and lower surfaces in the laminating direction while being heated in a vacuum state so as to integrate the laminate 80. In the present embodiment, a pair of flat and smooth pressing plates are used.

Figure 5:
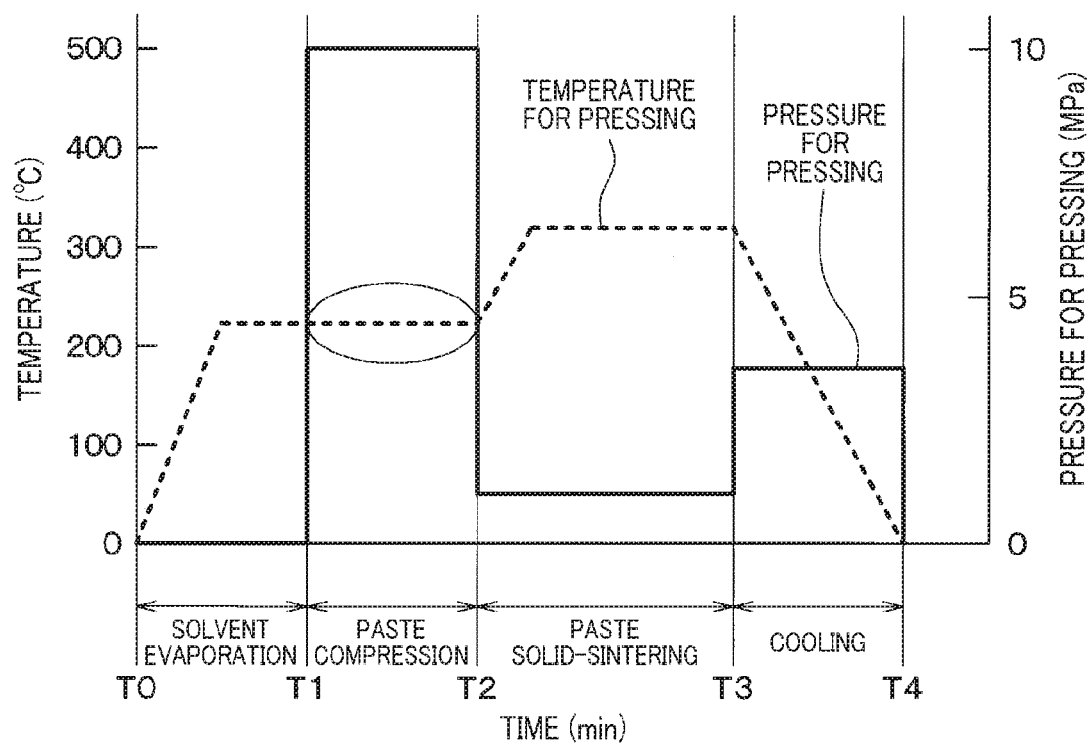
FIG. 5 is a diagram that shows a manufacturing condition at a third step shown in FIG. 4H.

With reference to FIGS. 5 and 6, a step of integrating the laminate 80 in the present embodiment will hereinafter be described specifically.

Figure 6A:
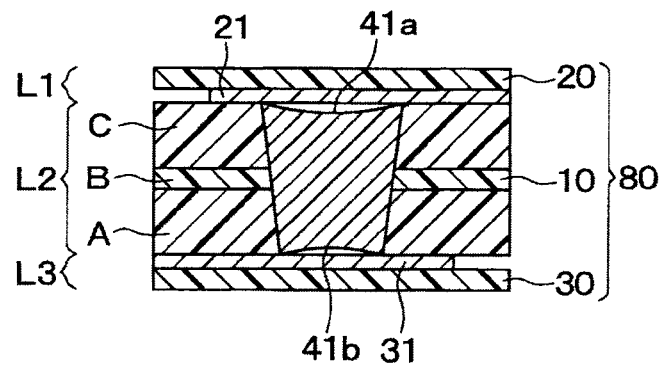
FIGS. 6A-6C are a diagram that shows a cross-section of a workpiece (a laminate) at the third step shown in FIG. 4H.

Initially, as shown in FIGS. 5 and 6A, in the manufacturing method according to the present embodiment, the laminate 80 is heated while being slightly pressed (e.g., at 0.1 MPa) at a temperature that allows the organic solvent added to the first and second conductive pastes 41 and 51 to evaporate (e.g., about 225° C.) until a time point T1. The organic solvent included in the first and second conductive pastes 41 and 51 is thereby evaporated. The heating temperature at this time is set to be lower than the melting point of the thermoplastic resin that configures the insulating substrate 10, and lower than the sintering temperature of the first and second conductive pastes 41 and 51. As such, in the manufacturing method according to the present embodiment, the heating temperature is set to be lower than the melting point of the thermoplastic resin to thereby prevent the thermoplastic resin from being liquefied, and restrain fluidization of the thermoplastic resin. Moreover, the heating temperature is set to be lower than the sintering temperature of each of the first and second conductive pastes 41 and 51 to thereby prevent the first and second conductive pastes 41 and 51 from being sintered at this stage. As such, in the manufacturing method according to the present embodiment, a step of evaporating the organic solvent corresponds to a "solvent evaporation step". Although the laminate 80 is heated while being slightly pressed in the present embodiment, the laminate 80 does not necessarily need to be pressed, and what is only needed is to evaporate the organic solvent by the heating.

The organic solvent included in the first and second conductive pastes 41 and 51 refers to the organic solvent that remains without being absorbed by the absorbent paper 70 at the steps in FIGS. 4B and 4D.

Figure 6B:
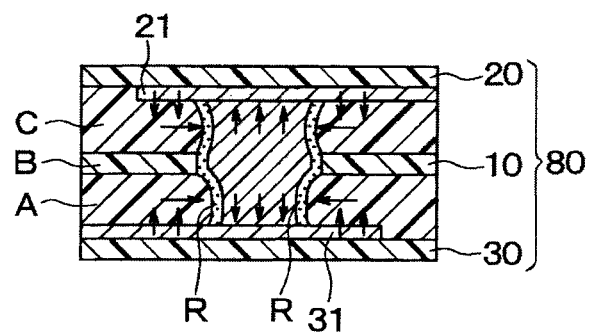

Next, as shown in FIGS. 5 and 6B, in the manufacturing method according to the present embodiment, the laminate 80 is pressed in the laminating direction of the laminate 80 while being heated at a temperature that allows the thermoplastic resin that configures the insulating substrate 10 to be elastically deformed until a time point T2. The heating temperature at this time is set to be lower than the melting point of the thermoplastic resin that configures the insulating substrate 10, and lower than the sintering temperature of the first and second conductive pastes 41 and 51. As such, in the manufacturing method according to the present embodiment, the heating temperature is set to be lower than the melting point of the thermoplastic resin to thereby ensure the thermoplastic resin to be elastically deformed without fluidizing (being liquefied). Moreover, the heating temperature is set to be lower than the sintering temperature of the first and second conductive pastes 41 and 51 to thereby prevent the first and second conductive pastes 41 and 51 from being sintered at this stage.

In the manufacturing method according to the present embodiment, the laminate 80 is pressed in the laminating direction of the laminate 80 while being heated at such a temperature to thereby elastically deform the thermoplastic resin that configures the insulating substrate 10. As shown in FIG. 6B, this causes the thermoplastic resin to apply a pressure in a direction perpendicular to the laminating direction of the laminate 80 to the first and second conductive pastes 41 and 51. The pressure in such a direction is applied to the first and second conductive pastes 41 and 51 to thereby allow the first and second conductive pastes 41 and 51 to move in the laminating direction of the laminate 80. Accordingly, the first and second conductive pastes 41 and 51 are tightly adhered to the front and rear surface patterns 21 and 31, and connection or fixing of the first and second conductive pastes 41 and 51 to the front and rear surface patterns 21 and 31 is promoted. As such, in the manufacturing method according to the present embodiment, a step of elastically deforming the thermoplastic resin to apply a pressure to the first and second conductive pastes 41 and 51 corresponds to a "paste compression step". As shown in FIG. 5, in the present embodiment, the laminate 80 is pressed between the time points T1 and T2 with a pressure larger than the pressing force applied until the time point T1, while being heated to a temperature equivalent to the temperature used until the time point T1. In other words, to elastically deform the thermoplastic resin that configures the insulating substrate 10 to apply a sufficient pressure to the first and second conductive pastes 41 and 51, the laminate 80 is pressed with a large pressure.

Figure 6C:
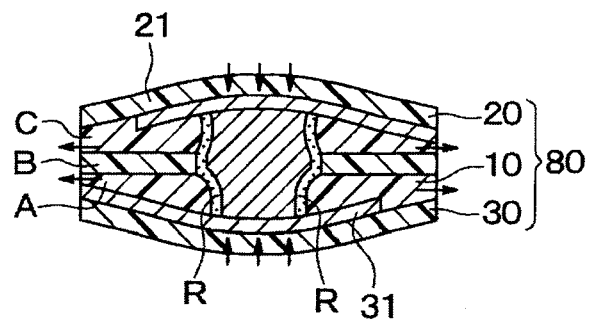

Next, in the manufacturing method according to the present embodiment, the laminate 80 is pressed in the laminating direction of the laminate 80, while being heated to a temperature equal to or higher than the melting point of the thermoplastic resin that configures the insulating substrate 10, and equal to or higher than the sintering temperature of each of the first and second conductive pastes 41 and 51, until a time point T3. As shown in FIG. 6C, the thermoplastic resin is thereby fluidized inside the laminate 80, while being allowed to flow out of the laminate 80. By doing so, a high pressure is applied to the first and second conductive pastes 41 and 51 in the direction perpendicular to the laminating direction of the laminate 80, and connection or fixing of the first and second conductive pastes 41 and 51 to the front and rear surface patterns 21 and 31 is promoted. As such, in the manufacturing method according to the present embodiment, a step of solid-sintering the first and second conductive pastes 41 and 51 corresponds to a "paste solid-sintering step". As shown in FIG. 5, in the present embodiment, the laminate 80 is pressed between the time points T2 and T3 with a pressure smaller than the pressing force applied between the time points T1 and T2, while being heated to a temperature higher than the temperature used between the time points T1 and T2. In other words, to prevent the first and second conductive pastes 41 and 51 from moving, and furthermore prevent the thermoplastic resin from flowing out of the laminate 80 more than necessary, the laminate 80 is pressed with a small pressure.

In the manufacturing method according to the present embodiment, the laminate 80 is pressed while being heated, to allow particles in the powder of an alloy to be mutually brought into pressure-contact and solid-sintered, and allow the powder of an alloy and each of the front and rear surface patterns 21 and 31 to be brought into pressure-contact and solid-sintered, to thereby configure the first and second interlayer connecting members 40 and 50. Moreover, the first and second interlayer connecting members 40 and 50 are electrically connected to the front and rear surface patterns 21 and 31.

The organic solvent is evaporated, thereby causing a space to be formed in each of the first and second via holes 11 and 12. However, this space is minute, and hence solid sintering of the first and second interlayer connecting members 40 and 50 is not inhibited by that space.

Moreover, if the paste compression step is performed before the solvent evaporation step, the laminate 80 is pressed while the first and second conductive pastes 41 and 51 are in a pasty state, and hence disadvantageously causing the first and second conductive pastes 41 and 51 to move (fluidize) easily. Furthermore, in this case, the connection or fixing of the first and second conductive pastes 41 and 51 to the front and rear surface patterns 21 and 31 is also lost easily. In contrast to this, in the manufacturing method according to the present embodiment, the paste compression step is performed after the solvent evaporation step, and hence the first and second conductive pastes 41 and 51 less easily move (fluidize), and the connection or fixing of the first and second conductive pastes 41 and 51 to the front and rear surface patterns 21 and 31 is less easily lost.

Here, as described above, in the manufacturing method according to the present embodiment, the thermoplastic resin that configures the insulating substrate 10 is fluidized while being allowed to flow out of the laminate 80 to thereby apply a pressure to the first and second conductive pastes 41 and 51. As shown in FIG. 6B, a coherent layer R configured with each of the first and second conductive pastes 41 and 51 and the thermoplastic resin is thereby formed in the periphery of a part of each of the first and second conductive pastes 41 and 51 to which a pressure is applied by the thermoplastic resin. This coherent layer R is the one formed by infiltration of low-molecular components, evaporation components, and the like in the thermoplastic resin into each of the first and second conductive pastes 41 and 51, and resultant cohesion of a part of each of the first and second conductive pastes 41 and 51. This coherent layer R is a layer having resin components that have a low thermal conductivity dispersed in each of the first and second conductive pastes 41 and 51. In the thermoelectric conversion device 1 manufactured by the manufacturing method according to the present embodiment, formation of this coherent layer R results in a temperature difference between the front and the rear of each of the first and second interlayer connecting members 40 and 50 being more easily generated, and thermoelectric conversion efficiency is improved.

This coherent layer R is specific to the structure of the thermoelectric conversion device 1 according to the present embodiment and the manufacturing method according to the present embodiment. Therefore, by closely investigating a cross-section of each of the first and second via holes 11 and 12 in the thermoelectric conversion device, it is possible to easily determine whether or not the thermoelectric conversion device has been manufactured by the manufacturing method according to the present embodiment. Even if the first and second conductive pastes 41 and 51 flow out of the laminate 80, there may be a case where the coherent layer R remains inside the laminate 80.

Moreover, as shown in FIG. 6A, there may be a case where concave portions 41*a* and 41*b* are formed on an end face on the front surface protecting member 20 and an end face on the rear surface protecting member 30 of each of the first and second conductive pastes 41 and 51, respectively, in the workpiece (the laminate) before the step of integrating this laminate 80. These concave portions 41*a* and 41*b* are formed in the case as described below, for example. In other words, the concave portions 41*a* and 41*b* may be formed in the case where, when the organic solvent is absorbed by the absorbent paper 70 as described above, an excessively large amount of the organic solvent is absorbed by the absorbent paper 70, for example. Moreover, the concave portions 41*a* and 41b may also be formed in the case where, when the absorbent paper 70 which has been brought into contact with the first and second conductive pastes 41 and 51 is peeled off, the first and second conductive pastes 41 and 51 are also peeled off by being attached to the absorbent paper 70. Moreover, the concave portions 41a and 41b may also be formed in the case where, if the first and second via holes 11 and 12 are filled with the first and second conductive pastes 41 and 51, respectively, and afterwards the front surface 10a or the rear surface 10b of the insulating substrate 10 is smoothed with a squeegee (a spatula) or the like, the first and second conductive pastes 41 and 51 are peeled off by being attached to the squeegee. In the present embodiment, the concave portion 41a on the front surface protecting member 20 and the concave portion 41b on the rear surface protecting member 30 out of the concave portions 41a and 41b are hereinafter referred to as a front-side concave portion 41a and a rear-side concave portion 41b, respectively. In the case where such concave portions 41a and 41b are formed in the first and second conductive pastes 41 and 51, a clearance may be made between each of the first and second conductive pastes 41 and 51 and the front surface pattern 21 or the rear surface pattern 31.

As with the manufacturing method described in PTL 1, assuming that the heating is performed at a temperature that allows the thermoplastic resin to fluidize (a temperature equal to or higher than the melting point of the thermoplastic resin) at the initial pressing, the liquefied thermoplastic resin more easily enters the above-described clearance. Therefore, as described above, in the manufacturing method described in PTL 1, the connection or fixing of the first and second conductive pastes 41 and 51 to the front and rear surface patterns 21 and 31 is more easily inhibited, and the event in which the first and second conductive pastes 41 and 51 fluidize along with the thermoplastic resin more easily occurs.

In contrast to this, in the manufacturing method according to the present embodiment, the laminate 80 is pressed while being heated at a temperature that allows the thermoplastic resin to be elastically deformed, as described above, so as to elastically deform the thermoplastic resin without liquefying the same to thereby cause the thermoplastic resin to apply a pressure to the first and second conductive pastes 41 and 51. Accordingly, in the manufacturing method according to the present embodiment, the thermoplastic resin less easily enters the above-described clearance, and the connection or fixing of the first and second conductive pastes 41 and 51 to the front and rear surface patterns 21 and 31 is less easily inhibited, and hence the event in which the first and second conductive pastes 41 and 51 disadvantageously fluidize less easily occurs. Owing to this elastic deformation of the thermoplastic resin, the first and second conductive pastes 41 and 51 are allowed to tightly adhere to the front and rear surface patterns 21 and 31, and the connection or fixing of the first and second conductive pastes 41 and 51 to the front and rear surface patterns 21 and 31 is more easily promoted. As such, in the manufacturing method according to the present embodiment, the first and second conductive pastes 41 and 51 are allowed to tightly adhere to the front and rear surface patterns 21 and 31 before the pressing at the temperature equal to or higher than the melting point of the thermoplastic resin. In the manufacturing method according to the present embodiment, the first and second conductive pastes 41 and 51 thereby less easily fluidize during pressing at the temperature equal to or higher than the melting point.

As described above, in the manufacturing method according to the present embodiment, the step of integrating the laminate 80 corresponds to a "third step". Although no particular limitation is imposed, a cushioning material such as rock wool paper may be disposed between the laminate 80 and each of the pressing plates when the laminate 80 is integrated.

Afterwards, as shown in FIGS. 6A-6C, in the manufacturing method according to the present embodiment, the laminate 80 is integrated by being cooled until a time point T4, and the thermoelectric conversion device 1 shown in FIG. 1 is manufactured. As shown in FIG. 5, the laminate 80 is pressed between the time points T3 and T4 with a pressure larger than the pressing force applied between the time points T2 and T3, while being heated to a temperature higher than the temperature used between the time points T2 and T3. In the present embodiment, the pressing is performed at such a temperature and with such a pressure so as to complete this cooling step as early as possible.

In the manufacturing method according to the present embodiment, by changing as appropriate the size of the planar shape or thickness of the insulating substrate 10, and the number, the diameter, or the like of each of the first and second via holes 11 and 12, it is possible to manufacture the thermoelectric conversion device 1 having a desired conversion efficiency. Moreover, the manufacturing steps neither increase in number nor become complicated depending on application purposes. In other words, in the manufacturing method according to the present embodiment, the thermoelectric conversion device 1 can achieve an improved degree of freedom in designing.

Furthermore, the thermoelectric conversion device 1 according to the present embodiment can generate a large electric power because each of the first and second interlayer connecting members 40 and 50 is formed with an alloy that has a plurality of metal atoms that maintain a predetermined crystal structure. Around each of the first and second interlayer connecting members 40 and 50, the insulating substrate 10 configured to include the thermoplastic resin is disposed. As a result, in the thermoelectric conversion device 1 according to the present embodiment, the tight adhesiveness between each of the first and second interlayer connecting members 40 and 50, and each of the front and rear surface patterns 21 and 31 can be improved. Accordingly, a much larger electric power can be generated.

Moreover, in the thermoelectric conversion device 1 according to the present embodiment, the insulating substrate 10 is disposed between the front surface pattern 21 (the front surface protecting member 20) and the rear surface pattern 31 (the rear surface protecting member 30), and no airflow is generated between the front surface pattern 21 (the front surface protecting member 20) and the rear surface pattern 31 (the rear surface protecting member 30). Therefore, it is possible to restrain a decrease in difference of heat between the front surface pattern 21 (the front surface protecting member 20) and the rear surface pattern 31 (the rear surface protecting member 30).

In the thermoelectric conversion device 1 according to the present embodiment, there has been described an example that uses the powder of a Bi—Sb—Te alloy as the first conductive paste 41 and uses the powder of a Bi—Te alloy as the second conductive paste 51. However, the powder of each alloy is not limited thereto. For example, the powder of an alloy that configures each of the first and second conductive pastes 41 and 51 may be selected as appropriate from copper, constantan, Chromel, Alumel, or the like alloyed with iron, nickel, chromium, copper, silicon, or the like. Moreover, the powder of an alloy that configures each of the first and second conductive pastes 41 and 51 may be selected as appropriate from an alloy of each of tellurium, bismuth, antimony, and selenium, or an alloy of each of silicon, iron, and aluminum.

Figure 7:
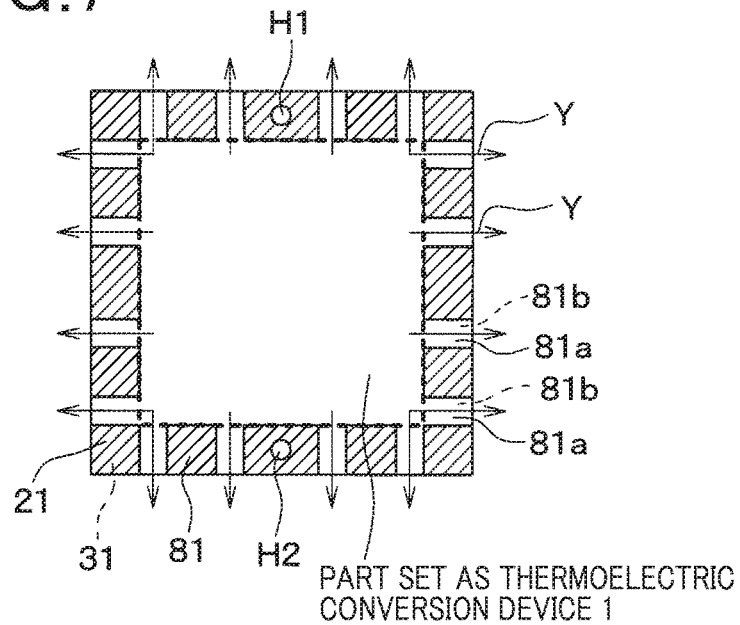
FIG. 7 is a diagram that shows a planar configuration of the workpiece (the laminate) that includes a peripheral edge part.

Moreover, as shown in FIG. 7, in the manufacturing method according to the present embodiment, a part of the laminate 80 on an inner side with respect to a peripheral edge part 81 when viewed from the laminating direction may be set as the thermoelectric conversion device 1, and the peripheral edge part 81 may not be set as the thermoelectric conversion device 1. At this time, for example, the laminate 80 is prepared in which both of its left end part and right end part in FIGS. 2 and 3 (parts configured with the front and rear surface protecting members 20 and 30, and the front and rear surface patterns 21 and 31) are extended in the right and left direction, and the parts thus extended may be set as the peripheral edge part 81. In other words, the laminate 80 in which the front and rear surface protecting members 20 and 30 and the front and rear surface patterns 21 and 31 are disposed in the peripheral edge part 81 may be prepared. This peripheral edge part 81 can be used as a part touched by a person or the like for transportation or the like of the workpiece (the laminate) at manufacturing, for example. At this time, the peripheral edge part 81 is cut away after the third step, and a part of the laminate 80 allowed to remain after the cutting of the peripheral edge part 81 may be set as the thermoelectric conversion device 1. In this case, the insulating substrate 10 that has a part that configures the peripheral edge part 81 may be prepared at the first step, and the laminate 80 in which the front and rear surface protecting members 20 and 30 and the front and rear surface patterns 21 and 31 are also disposed in the peripheral edge part 81 may be formed at the second step.

In the manufacturing method according to the present embodiment, if a part of the laminate 80 other than the part set as the thermoelectric conversion device 1 is set as the peripheral edge part 81, it is preferable to form a slit 81*a* in the front surface pattern 21 in the peripheral edge part 81, as shown in FIG. 7, before the pressing at the third step. Moreover, similarly, it is preferable to form a slit 81*b* in the rear surface pattern 31 in the peripheral edge part 81.

In other words, in the manufacturing method according to the present embodiment, it is preferable at the second step to dispose the front surface protecting member 20 that includes the front surface pattern 21 formed in the peripheral edge part 81 and having the slit 81*a* formed therein, the slit 81*a* extending from the outer circumference of the thermoelectric conversion device 1 to the outer circumference of the peripheral edge part 81. Moreover, similarly, it is preferable at the second step that the slit 81*b* extending from the outer circumference of the thermoelectric conversion device 1 to the outer circumference of the peripheral edge part 81 is formed in the rear surface pattern 31 formed in the peripheral edge part 81. In the present embodiment, the slit 81*a* formed in the front surface pattern 21 will hereinafter be referred to as a front-side slit 81*a*, while the slit 81*b* formed in the rear surface pattern 31 will hereinafter be referred to as a rear-side slit 81*b*.

In the manufacturing method according to the present embodiment, such front-side and rear-side slits 81*a* and 81*b* are formed to thereby more easily allow the thermoplastic resin that configures the insulating substrate 10 to flow out of the laminate 80 through the front-side slit 81*a* or the rear-side slit 81*b* at the third step (see the reference sign Y in FIG. 7). In other words, if the front-side slit 81*a* is not formed, an outflow of the thermoplastic resin is inhibited by the front surface pattern 21 in the peripheral edge part 81. In contrast to this, if the front-side slit 81*a* is formed as with the manufacturing method according to the present embodiment, the thermoplastic resin is more easily allowed to flow out of the laminate 80. Similarly, if the rear-side slit 81*b* is not formed, an outflow of the thermoplastic resin is inhibited by the rear surface pattern 31 in the peripheral edge part 81. In contrast to this, if the rear-side slit 81*b* is formed as with the manufacturing method according to the present embodiment, the thermoplastic resin is more easily allowed to flow out of the laminate 80.

Here, in the case where the front surface pattern 21 or the rear surface pattern 31 is removed in the entire region of the peripheral edge part 81 of the laminate 80, for example, the thermoplastic resin is of course more easily allowed to flow out. However, in this case, the ratio of the soft thermoplastic resin in the peripheral edge part 81 becomes large by an amount of the front surface pattern 21 or the rear surface pattern 31 removed therefrom. As a result, stability of the laminated structure of the laminate 80 is deteriorated. Therefore, if the peripheral edge part 81 is picked up by human hands or the like, for example, the laminated structure of the laminate 80 is easily collapsed. In contrast to this, in the manufacturing method according to the present embodiment, the front-side and rear-side slits 81*a* and 81*b* are formed in the peripheral edge part 81 of the laminate 80 to allow the part other than the front-side and rear-side slits 81*a* and 81*b* to remain, to thereby ensure stability of the laminated structure of the laminate 80.

As shown in FIG. 7, through holes H1 and H2 each penetrating each of the layers L1 to L3 that configure the laminate 80 (see the reference signs L1 to L3 in FIG. 6A are formed in the laminate 80 according to the present embodiment as a hole into which a pin for aligning each of the layers L1 to L3 is inserted when each of the layers is laminated.

As described above, in the method of manufacturing the thermoelectric conversion device 1 according to the present embodiment, the following steps, namely, the solvent evaporation step, the paste compression step, and the paste solid-sintering step are performed in this order at the step of pressing the laminate 80 from the laminating direction of the laminate 80 while heating the laminate 80. In other words, at the solvent evaporation step, the laminate 80 is heated to a temperature that allows the organic solvent to evaporate and is lower than the melting point of the thermoplastic resin and lower than the sintering temperature of each of the first and second conductive pastes 41 and 51 to thereby evaporate the organic solvent added to the first and second conductive pastes 41 and 51. At the paste compression step, the laminate 80 is pressed in the laminating direction of the laminate 80 while being heated to a temperature that allows the thermoplastic resin to be elastically deformed and is lower than the melting point of the thermoplastic resin and lower than the sintering temperature of each of the first and second conductive pastes and 51. At the paste compression step, this allows the thermoplastic resin to be elastically deformed so as to apply a pressure in the direction perpendicular to the laminating direction of the laminate 80 to the first and second conductive pastes 41 and 51. At the paste solid-sintering step, the laminate 80 is pressed in the laminating direction of the laminate 80 while being heated to a temperature equal to or higher than the melting point of the thermoplastic resin and equal to or higher than the sintering temperature of each of the first and second conductive pastes 41 and 51. At the paste solid-sintering step, this allows the thermoplastic resin to fluidize inside the laminate 80 while allowing the thermoplastic resin to flow out of the laminate 80 so as to apply a pressure in the direction perpendicular to the laminating direction of the laminate 80 to the first and second conductive pastes 41 and 51. In addition to this, the first conductive paste 41 is solid-sintered to configure the first interlayer connecting member 40, and the second conductive paste 51 is solid-sintered to configure the second interlayer connecting member 50.

Accordingly, in the manufacturing method according to the present embodiment, the thermoplastic resin is elastically deformed as described above to thereby apply a pressure in the direction perpendicular to the laminating direction of the laminate 80 to the first and second conductive pastes 41 and 51 at the third step. At this time, unlike the manufacturing method described in PTL 1, in which the liquefied thermoplastic resin is fluidized, the thermoplastic resin is elastically deformed. Accordingly, even if a clearance is made between each of the first and second conductive pastes 41 and 51 and the front surface pattern 21 or the rear surface pattern 31, the thermoplastic resin less easily enters this clearance. Therefore, in the manufacturing method according to the present embodiment, the phenomenon less easily occurs in which the thermoplastic resin enters this clearance and inhibits connection or fixing of the first and second conductive pastes 41 and 51 to the front and rear surface patterns 21 and 31 to thereby disadvantageously allow the first and second conductive pastes 41 and 51 to fluidize. The pressure in the direction perpendicular to the laminating direction of the laminate 80 is more easily applied to the first and second conductive pastes 41 and 51, without the thermoplastic resin being allowed to enter this clearance. In the manufacturing method according to the present embodiment, the first and second conductive pastes 41 and 51 are thereby allowed to tightly adhere to the front and rear surface patterns 21 and 31, and the connection or fixing of the first and second conductive pastes 41 and 51 to the front and rear surface patterns 21 and 31 is more easily promoted.

As such, in the manufacturing method according to the present embodiment, the first and second conductive pastes 41 and 51 are allowed to tightly adhere to the front and rear surface patterns 21 and 31 before the pressing at a temperature equal to or higher than the melting point of the thermoplastic resin. In the manufacturing method according to the present embodiment, the first and second conductive pastes 41 and 51 thereby less easily fluidize during pressing at the temperature equal to or higher than the melting point. Moreover, the thermoplastic resin is fluidized inside the laminate 80 while being allowed to flow out of the laminate 80, and hence when compared with the manufacturing method described in PTL 1, a larger amount of the thermoplastic resin inside the laminate 80 is allowed to flow out. Consequently, in the manufacturing method according to the present embodiment, the part of the laminate 80 where the thermoplastic resin is positioned becomes thinner than the part of the laminate 80 where the first and second conductive pastes 41 and 51 are positioned. Even if the first and second conductive pastes 41 and 51 attempt to move in a direction of a plane perpendicular to the laminating direction of the laminate 80, the first and second conductive pastes 41 and 51 are thereby more easily stopped by the anchor effect produced by the part of the laminate 80 thus made thinner. This also results in the first and second conductive pastes 41 and 51 less easily fluidizing. Thus in the manufacturing method according to the present embodiment, when the laminate 80 is pressed, the first and second conductive pastes 41 and 51 can be ensured to less easily fluidize and more easily be fixed and maintained at positions before the pressing, and at the same time the thermoplastic resin can be allowed to flow out of the workpiece (the laminate) to thereby promote fluidization of the thermoplastic resin.

Moreover, in the manufacturing method according to the present embodiment, there is prepared, at the first step, the insulating substrate 10 that has the layer A configured with a thermoplastic resin, the layer B configured with a thermosetting resin, and the layer C configured with a thermoplastic resin, disposed in this order in the thickness direction. In other words, in the manufacturing method according to the present embodiment, there is prepared the insulating substrate 10 in which the first and second via holes 11 and 12 are formed to penetrate, in the thickness direction, the layer A configured with a thermoplastic resin, the layer B configured with a thermosetting resin, and the layer C configured with a thermoplastic resin.

Accordingly, in the manufacturing method according to the present embodiment, even if the first and second conductive pastes 41 and 51 fluidize during pressing at the temperature equal to or higher than the melting point of the thermoplastic resin at the third step, the first and second conductive pastes 41 and 51 impinge on the thermosetting resin positioned therearound, and their fluidization is thereby restrained. Therefore, in the manufacturing method according to the present embodiment, the first and second conductive pastes 41 and 51 can be ensured to less easily fluidize and more easily be fixed and maintained at positions before the pressing, in particular. Moreover, at this time, when compared with the case of preparing the insulating substrate 10 in which layers, each configured with a thermosetting resin, are disposed at both ends in the thickness direction, tight adhesiveness between the insulating substrate 10 and each of the front and rear surface patterns 21 and 31 or each of the front and rear surface protecting members 20 and 30 is improved. Moreover, the tight adhesiveness between the insulating substrate 10 and each of the rear surface protecting members 20 and 30 is improved to thereby more easily allow the thermoplastic resin to be disposed reliably between the adjacent front surface patterns 21, and between the adjacent rear surface patterns 31. In the manufacturing method according to the present embodiment, the phenomenon in which a leakage current disadvantageously flows between the two adjacent front surface patterns 21 or between the two adjacent rear surface patterns 31, or the like, thereby less easily occurs.

Moreover, in the manufacturing method according to the present embodiment, at the first step in particular, there is prepared the insulating substrate 10 in which the layer B configured with a thermosetting resin is positioned at the center of the insulating substrate 10 in the laminating direction of the laminate 80. In other words, in the manufacturing method according to the present embodiment, there is prepared the insulating substrate 10 in which the layers A and C each configured with a thermoplastic resin and having an equivalent thickness are provided on both sides of the layer B configured with a thermosetting resin.

Accordingly, in the manufacturing method according to the present embodiment, warpage of the laminate 80 due to thermal expansion or thermal contraction of the layers A and C configured with a thermoplastic resin less easily occurs after the third step.

Moreover, in the manufacturing method according to the present embodiment, the peripheral edge part 81 of the laminate 80 as viewed from the laminating direction of the laminate 80 is cut away after the third step, and the part of the laminate 80 which remains after the peripheral edge part 81 is cut away is provided as the thermoelectric conversion device 1. At the first step according to the present embodiment, there is prepared the insulating substrate 10 that has a part that configures the peripheral edge part 81. At the second step according to the present embodiment, there is formed the laminate 80 provided with the peripheral edge part 81 in which the front and rear surface protecting members 20 and 30 and the front and rear surface patterns 21 and 31 are disposed. In addition to this, in the manufacturing method according to the present embodiment, the laminate 80 is formed by disposing at least one of the front surface protecting member 20 that includes the front surface pattern 21 formed in the peripheral edge part 81 and having the front-side slit 81a formed therein, and the rear surface protecting member 30 that includes the rear surface pattern 31 formed in the peripheral edge part 81 and having the rear-side slit 81b formed therein. At the third step according to the present embodiment, the thermoplastic resin is allowed to flow out of the laminate 80 through at least one of the front-side slit 81a formed in the front surface protecting member 20 disposed at the second step and the rear-side slit 81b formed in the rear surface protecting member 30 disposed at the second step.

Accordingly, in the manufacturing method according to the present embodiment, the front-side slit 81a or the rear-side slit 81b is formed to thereby more easily allow the thermoplastic resin to flow out of the laminate 80 through the front-side slit 81a or the rear-side slit 81b at the third step. In other words, if the front-side slit 81a is not formed, the outflow of the thermoplastic resin is inhibited by the front surface pattern 21; however, if the front-side slit 81a is formed by the manufacturing method according to the present embodiment, the thermoplastic resin is more easily allowed to flow out through the front-side slit 81a. Similarly, if the rear-side slit 81b is not formed, the outflow of the thermoplastic resin is inhibited by the rear surface pattern 31; however, if the rear-side slit 81b is formed by the manufacturing method according to the present embodiment, the thermoplastic resin is more easily allowed to flow out through the rear-side slit 81b.

Here, in the case where the front surface pattern 21 or the rear surface pattern 31 is removed in the entire region of the peripheral edge part 81 of the laminate 80, for example, the thermoplastic resin is of course more easily allowed to flow out. However, in this case, the ratio of the soft thermoplastic resin in the peripheral edge part 81 becomes large by an amount of the front surface pattern 21 or the rear surface pattern 31 removed therefrom. As a result, stability of the laminated structure of the laminate 80 is deteriorated. Therefore, if the peripheral edge part 81 is picked up by human hands or the like, for example, the laminated structure of the laminate 80 is easily collapsed. In contrast to this, in the manufacturing method according to the present embodiment, the front-side and rear-side slits 81a and 81b are formed in the peripheral edge part 81 of the laminate 80 to allow the part other than the front-side and rear-side slits 81a and 81b to remain to thereby ensure stability of the laminated structure of the laminate 80.

Second Embodiment

Figure 8:
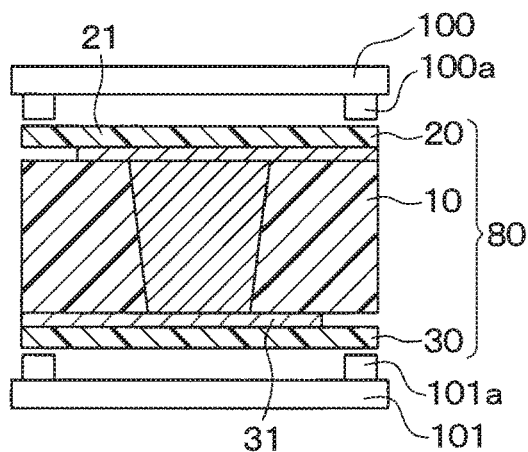
FIG. 8 is a diagram that shows a cross-sectional configuration of each of the workpiece (the laminate) and a pressing plate at a manufacturing step according to a second embodiment.
Figure 9:
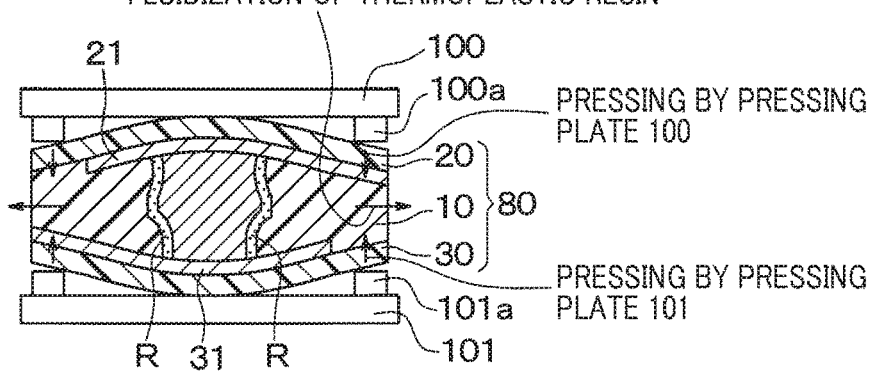
FIG. 9 is another diagram that shows a cross-sectional configuration of each of the workpiece (the laminate) and the pressing plate at a manufacturing step according to the second embodiment.

With reference to FIGS. 8 and 9, a second embodiment of the present disclosure will be described. The present embodiment is obtained by changing the shape of the pressing plates and the method of pressing the laminate 80 at the third step according to the first embodiment. Other configurations are similar to those in the first embodiment, and hence the description thereof will be omitted here.

In the first embodiment, a pair of flat and smooth pressing plates are used at the third step. However, as shown in FIG. 8, in the method of manufacturing the thermoelectric conversion device 1 according to the present embodiment, a pair of pressing plates 100 and 101 that have one or a plurality of convex portions 100a and 101a, respectively, are used. The pair of pressing plates 100 and 101 shown in the figure each have the plurality of convex portions 100a and 101a.

In the manufacturing method according to the present embodiment, the laminate 80 is pressed in the laminating direction to allow a part positioned between the two different first conductive pastes 41 or a part positioned between the two different second conductive pastes 51 to be pressed by the convex portions 100a and 101a.

Accordingly, in the manufacturing method according to the present embodiment, as shown in FIG. 9, when the pressing at a temperature equal to or higher than the melting point of the thermoplastic resin is performed at the third step, the above-described part is pressed by the convex portions 100a and 101a. In the manufacturing method according to the present embodiment, the part of the laminate 80 where the thermoplastic resin is positioned thereby more easily becomes thinner than the part of the laminate 80 where the first and second conductive pastes 41 and 51 are positioned. Therefore, even if the first and second conductive pastes 41 and 51 attempt to move in the direction of a plane perpendicular to the laminating direction of the laminate 80, the first and second conductive pastes 41 and 51 are more easily stopped by the anchor effect produced by the part of the laminate 80 thus made thinner. In the manufacturing method according to the present embodiment, the first and second conductive pastes 41 and 51 thereby less easily fluidize and are more easily fixed and maintained at positions before the pressing, in particular.

In the manufacturing method according to the present embodiment, it is possible to less easily allow the first and second conductive pastes 41 and 51 to fluidize by the anchor effect produced by the convex portions 100a and 101a of the pressing plates 100 and 101, respectively. As a result, as shown in FIGS. 8 and 9, the thermosetting resin that configures the insulating substrate 10 according to the first embodiment (i.e., the layer B configured with the thermosetting resin) is omitted. Accordingly, in the manufacturing method in the present embodiment, there is no need to prepare the insulating substrate 10 in which the layer A configured with a thermoplastic resin, the layer B configured with a thermosetting resin, and the layer C configured with a thermoplastic resin are disposed in this order, and the insulating substrate 10 configured with a thermoplastic resin only needs to be prepared. In other words, in the manufacturing method in the present embodiment, there is no need to perform the step of integrating these layers A to C.

The insulating substrate 10 according to the present embodiment may also have a configuration provided with the layer B configured with a thermosetting resin.

Other Embodiments

The present disclosure is not limited to the above-described embodiments, and can be changed as appropriate as follows.

Figure 10:
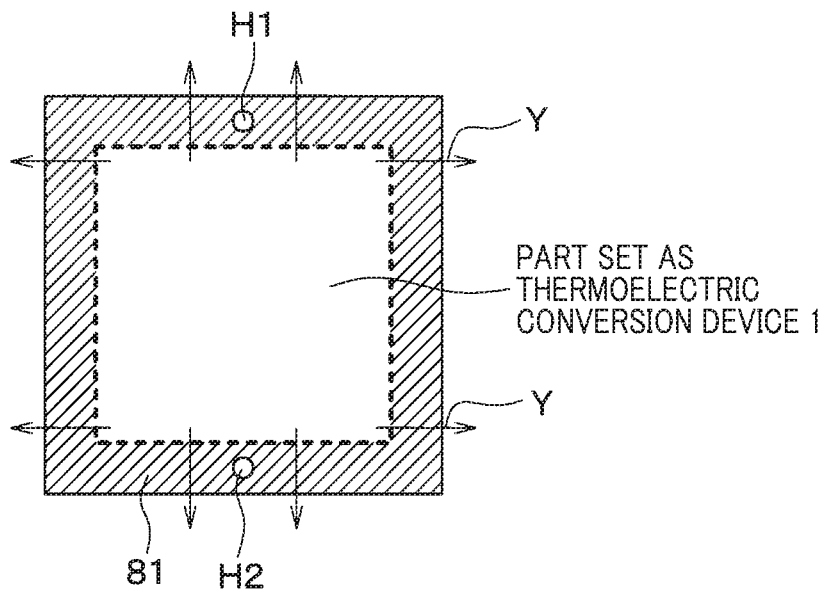
FIG. 10 is a diagram that shows a planar configuration of the workpiece (the laminate) that includes the peripheral edge part in another embodiment.
Figure 11:
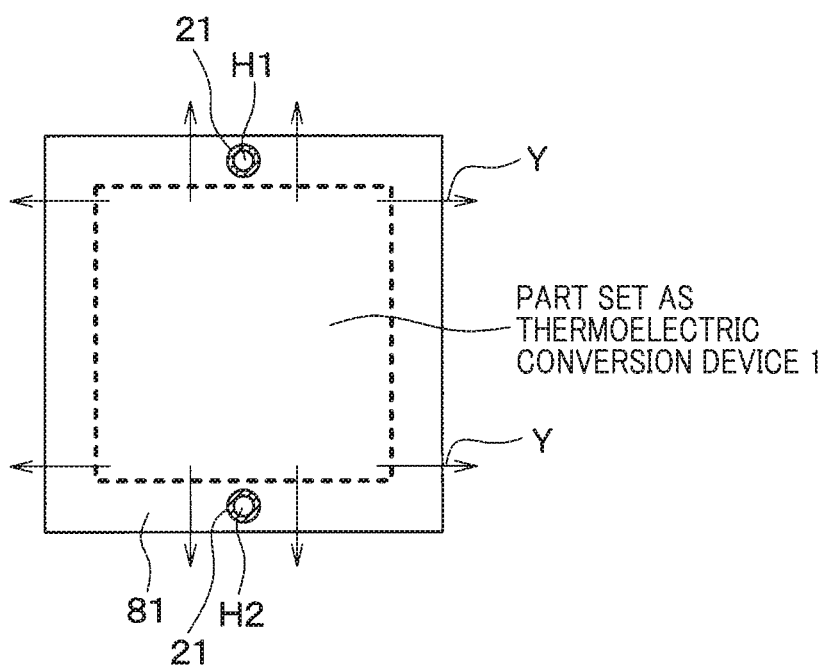
FIG. 11 is a diagram that shows a planar configuration of the workpiece (the laminate) that includes the peripheral edge part in still another embodiment.

For example, in the first embodiment, the part of the laminate 80 other than the part set as the thermoelectric conversion device 1 is set as the peripheral edge part 81, and the front-side and rear-side slits 81a and 81b are provided in the front and rear surface patterns 21 and 31, respectively, in the peripheral edge part 81. Specifically, in the front and rear surface patterns 21 and 31, there are provided the front-side and rear-side slits 81a and 81b each extending from the side where the part that is allowed to remain as the thermoelectric conversion device 1 is positioned, to the side opposite thereto across the peripheral edge part 81. The thermoplastic resin can easily flow out of the laminate 80 with these front-side and rear-side slits 81a and 81b. However, in the first embodiment, the front-side and rear-side slits 81a and 81b are not necessarily formed in the peripheral edge part 81 of the laminate 80, and as shown in FIG. 10, the front-side and rear-side slits 81a and 81b may not be provided. In this case as well, the thermoplastic resin can be allowed to flow out of the laminate 80 (see the reference sign Y in FIG. 10). Moreover, in the case where the part of the laminate 80 other than the part set as the thermoelectric conversion device 1 is set as the peripheral edge part 81, the method of more easily allowing the thermoplastic resin to flow out of the laminate 80 is not limited to the method of forming the front-side and rear-side slits 81a and 81b. As shown in FIG. 11, as one example of other methods, the front and rear surface patterns 21 and 31 in the entire region of the peripheral edge part 81 may be removed, for example. In FIG. 11, a few of the front and rear surface patterns 21 and 31 around the through holes H1 and H2 are allowed to remain without being removed for the reason to prevent an inflow of the thermoplastic resin to each of the through holes H1 and H2, and other reasons.

REFERENCE SIGNS LIST

10: insulating substrate, 20: front surface protecting member, 21: front surface pattern, 30: rear surface protecting member, 31: rear surface pattern, 40: first interlayer connecting member, 41: first conductive paste, 50: second interlayer connecting member, 51: second conductive paste, 80: laminate, 100: pressing plate, 101: pressing plate.

What is claimed is:
1. A method of manufacturing a thermoelectric conversion device, comprising:
  a first step of preparing an insulating substrate that includes a thermoplastic resin and has a first via hole and a second via hole both formed to penetrate the thermoplastic resin in a thickness direction, the first via hole being filled with a first conductive paste which is obtained by adding an organic solvent to a powder of an alloy having a plurality of metal atoms that maintain a predetermined crystal structure and processing the powder of an alloy into a paste, and the second via hole being filled with a second conductive paste which is obtained by adding an organic solvent to a powder of a metal of a type different from that of the alloy and processing the powder of the metal into a paste;
  a second step of forming a laminate by disposing a front surface protecting member having a front surface pattern which is brought into contact with the corresponding first and second conductive pastes on a front surface of the insulating substrate, and disposing a rear surface protecting member having a rear surface pattern which is brought into contact with the corresponding first and second conductive pastes on a rear surface of the insulating substrate; and
  a third step of pressing the laminate in a laminating direction of the laminate while heating the laminate, and solid-sintering the first conductive paste to configure a first interlayer connecting member and solid-sintering the second conductive paste to configure a second interlayer connecting member, so as to electrically connect the first and second interlayer connecting members to the front and rear surface patterns,
  the third step comprising:
  a solvent evaporation step of heating the laminate to a temperature that allows the organic solvents to evaporate and is lower than a melting point of the thermoplastic resin and lower than a sintering temperature of the first and second conductive pastes to thereby evaporate the organic solvents added to the first and second conductive pastes;
  a paste compression step of applying a pressure in a direction perpendicular to the laminating direction of the laminate to the first and second conductive pastes after the solvent evaporation step by pressing the laminate in the laminating direction of the laminate while heating the laminate to a temperature that allows the thermoplastic resin to be elastically deformed and is lower than the melting point of the thermoplastic resin and lower than the sintering temperature of the first and second conductive pastes to thereby elastically deform the thermoplastic resin; and
  a paste solid-sintering step of solid-sintering the first conductive paste to configure the first interlayer connecting member and solid-sintering the second conductive paste to configure the second interlayer connecting member after the paste compression step by pressing the laminate in the laminating direction of the laminate while heating the laminate to a temperature equal to or higher than the melting point of the thermoplastic resin and equal to or higher than the sintering temperature of the first and second conductive pastes to thereby fluidize the thermoplastic resin inside the laminate while allowing the thermoplastic resin to flow out of the laminate so as to apply a pressure in the direction perpendicular to the laminating direction of the laminate to the first and second conductive pastes.

2. The method of manufacturing the thermoelectric conversion device according to claim 1, wherein the insulating substrate having a first layer configured with the thermoplastic resin, a second layer configured with a thermosetting resin, and a third layer configured with a thermoplastic resin disposed in this order in the thickness direction, and having the first and second via holes formed to penetrate the first, second and third layers in the thickness direction is prepared at the first step.

3. The method of manufacturing the thermoelectric conversion device according to claim 1, wherein
  the insulating substrate is prepared at the first step to have a part that configures a peripheral edge part of the laminate,
  the laminate is formed at the second step, in which the front surface protecting member, the rear surface protecting member, the front surface pattern, and the rear surface pattern are also disposed in the peripheral edge part, and in which at least one of the front surface protecting member has a front-side slit formed in the front surface pattern formed in the peripheral edge part so as to extend from an outer periphery of the thermoelectric conversion device to an outer periphery of the peripheral edge part, and the rear surface protecting member has a rear-side slit formed in the rear surface pattern formed in the peripheral edge part so as to extend from an outer periphery of the thermoelectric conversion device to an outer periphery of the peripheral edge part,
  the thermoplastic resin is allowed to flow out of the laminate at the third step through at least one of the front-side slit formed in the front surface protecting member disposed at the second step and the rear-side slit formed in the rear surface protecting member disposed at the second step, and the peripheral edge part is cut away from the laminate after the third step.

4. The method of manufacturing the thermoelectric conversion device according to claim 1, wherein the laminate is pressed in the laminating direction of the laminate at the third step by using a pressing plate that has one or a plurality of convex portions so that a portion located between two different first conductive pastes or a portion located between two different second conductive pastes is pressed by the convex portion.

* * * * *